United States Patent [19]
Flanders et al.

[11] 4,360,586
[45] Nov. 23, 1982

[54] SPATIAL PERIOD DIVISION EXPOSING

[75] Inventors: Dale C. Flanders, Lexington; Henry I. Smith, Sudbury, both of Mass.

[73] Assignee: Massachusetts Institute of Technology, Cambridge, Mass.

[21] Appl. No.: 140,150

[22] Filed: Apr. 14, 1980

Related U.S. Application Data

[63] Continuation-in-part of Ser. No. 43,310, May 29, 1979, abandoned.

[51] Int. Cl.³ .......................... B05D 3/06; G03F 9/00
[52] U.S. Cl. ................................ 430/321; 350/162 R; 427/43.1; 427/162; 250/482.1
[58] Field of Search ................... 350/162 R; 427/43.1, 427/162; 430/321

[56] References Cited
U.S. PATENT DOCUMENTS
3,615,449  10/1971  Greenaway ..................... 350/162 R

FOREIGN PATENT DOCUMENTS
1285763  12/1968  Fed. Rep. of Germany ... 350/162 R

OTHER PUBLICATIONS
Edgar "Optica Acta" vol. 16, No. 3, pp. 281-287 1969.
Kodate et al., "Applied Optics" vol. 14, No. 2, pp. 522-525 Feb. 1975.
Knop "Optics Comm." vol. 18, pp. 298-303 1976.
Rogers, "Jour. Opt. Soc. America" vol. 62, No. 7, pp. 917, 918, Ju. 1972.

Primary Examiner—John H. Newsome
Attorney, Agent, or Firm—Arthur A. Smith, Jr.; Charles Hieken

[57] ABSTRACT

Soft carbon-K X-rays (38) expose a PMMA photoresist (31) on an oxide layer (32) of a silicon substrate (33) through a parent mask (30) separated a distance S from the resist by a spacer (34) with the parent mask slits (12, 17) defining a spatial period p to establish an intensity pattern of period p/n at the photomask with $S = p^2/n\lambda$, where $\lambda$ is the wavelength of the incident radiation and $\lambda < p$.

8 Claims, 22 Drawing Figures

1μm

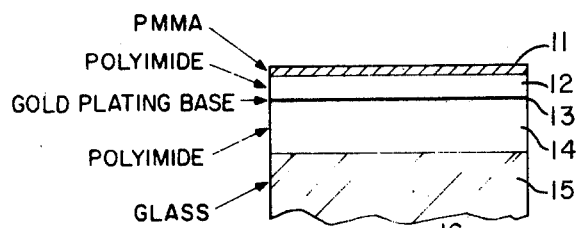
Fig. 3A
Fig. 3B  X-RAY EXPOSE GRATING
Fig. 3C  EVAPORATE CHROME
Fig. 3D  DISSOLVE PMMA (Liftoff)
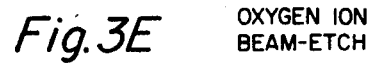
Fig. 3E  OXYGEN ION BEAM-ETCH
Fig. 3F  ELECTROPLATE GOLD
Fig. 3G  REMOVE GLASS $z = 4.3 \mu m$ $z = 2.9 \mu m$ $z = 2.2 \mu m$ INCIDENT X-RADIATION, $\lambda = 4.5$ nm

SPATIAL PERIOD DIVISION EXPOSING

The Government has rights in this invention pursuant to Contract Number AF19(628)-78-C-0002 awarded by the U.S. Department of the Air Force.

REFERENCE TO PRIOR COPENDING APPLICATION

This application is a continuation-in-part of Application Ser. No. 43,310 filed May 29, 1979, now abandoned.

BACKGROUND OF THE INVENTION

The present invention relates in general to exposing patterns with radiant energy passing through masks and more particularly concerns novel apparatus and techniques for exposing patterns of spatial period p/n using near-field diffraction from masks of spatial period p with n being an integer greater than 1. The invention may be used with visible, UV or X-ray radiation (as well as electrons or ions) to produce gratings of exceptionally fine spatial period. A list of numbered references is appended.

Periodic and quasi-periodic structures of submicrometer spatial period are of fundamental importance in a number of areas such as guided wave optics as described in (1), distributive-feedback and distributed-Bragg-reflector lasers as described in (2), graphoepitaxy as described in (3) and (4) and planar superlattice electronic devices as described in (5). In addition high-quality periodic structures are essential elements in optics and spectroscopy at all wavelengths, and serve as calibration standards for scanning electron beam systems as described in (6). For spatial periods from about 2 $\mu$m to of the order of 0.2 $\mu$m, holographic lithography has been the preferred method of exposing periodic and quasi-periodic patterns, either directly on substrates of interest or on masks which are subsequently replicated photolithographically or with soft X-rays as described in (8). Holography in high-refractive-index media has been used to expose gratings of 110 nm period as described in (9), but the technique is cumbersome and difficult to extend for periods much below about 70 nm. Sources with wavelengths shorter than the He:Cd laser (325 nm) generally have limited coherence length and poor mode quality, or require complex apparatus for up-conversion as described in (10).

Accordingly, it is an important object of the invention to provide improved apparatus and techniques for exposing spatial periods, typically below 10 $\mu$m, useful in one or more of the applications described above and also in very-far UV and X-ray optics.

It is another object of the invention to achieve the preceding object with apparatus and techniques that are relatively free from complexity.

It is a further object of the invention to achieve one or more of the preceding objects, especially in conjunction with soft X-ray lithography.

It is an object of the invention to employ near-field diffraction from periodic and quasi-periodic "parent" masks to produce intensity patterns with spatial periods finer than the parent mask, a phenomenon previously observed with visible light and described in (11).

SUMMARY OF THE INVENTION

According to the invention, a source of radiant energy of wavelength $\lambda$ illuminates a surface to be exposed through a mask having a spatial period p separated from the surface by a distance approximately $S_n = p^2/n\lambda$, where n is an integer greater than 1.

Numerous other features, objects and advantages of the invention will become apparent from the following specification when read in connection with the accompanying drawing in which:

BRIEF DESCRIPTION OF THE DRAWING

FIGS. 3A–3G are diagrammatic representations of the steps involved in fabricating a parent X-ray mask;

DETAILED DESCRIPTION OF PREFERRED EMBODIMENTS

Figure 1B:
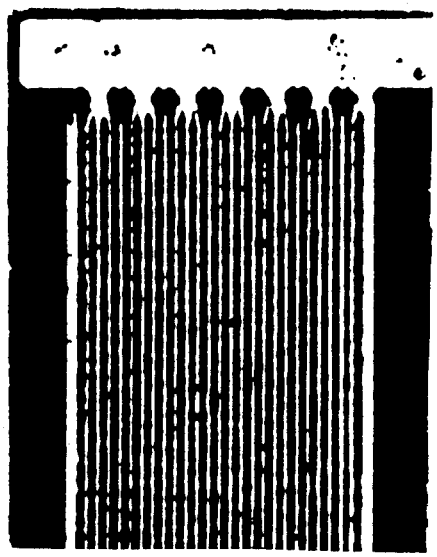
FIG. 1B is an optical micrograph of RF sputter etched chromium following exposure of photoresist over the chromium through the photomask of FIG. 1A at a mask-to-resist gap of about 8 $\mu$m, producing the second spatial-frequency multiple (1.27 $\mu$m) of the pattern of FIG. 1A.
Figure 1A:
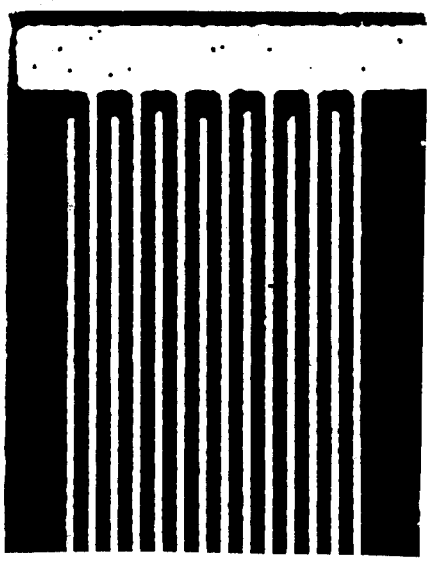
FIG. 1A is an optical micrograph of an interdigital pattern of spatial period p of 2.54 $\mu$m that had been RF sputter etched into chromium on a photomask.

With reference now to the figures and drawings and more particularly FIGS. 1A and 1B above, there are shown photomicrographs illustrating the doubling of a grating of spatial period 2.54 $\mu$m of FIG. 1A by shadow printing it at a gap of about 8 $\mu$m, yielding a grating of 1.27 $\mu$m spatial period as shown in FIG. 1B. Both gratings have been RF sputter etched into chromium, using photoresist to mask against the etching in accordance with the common practice of microlithography.

Figure 2:
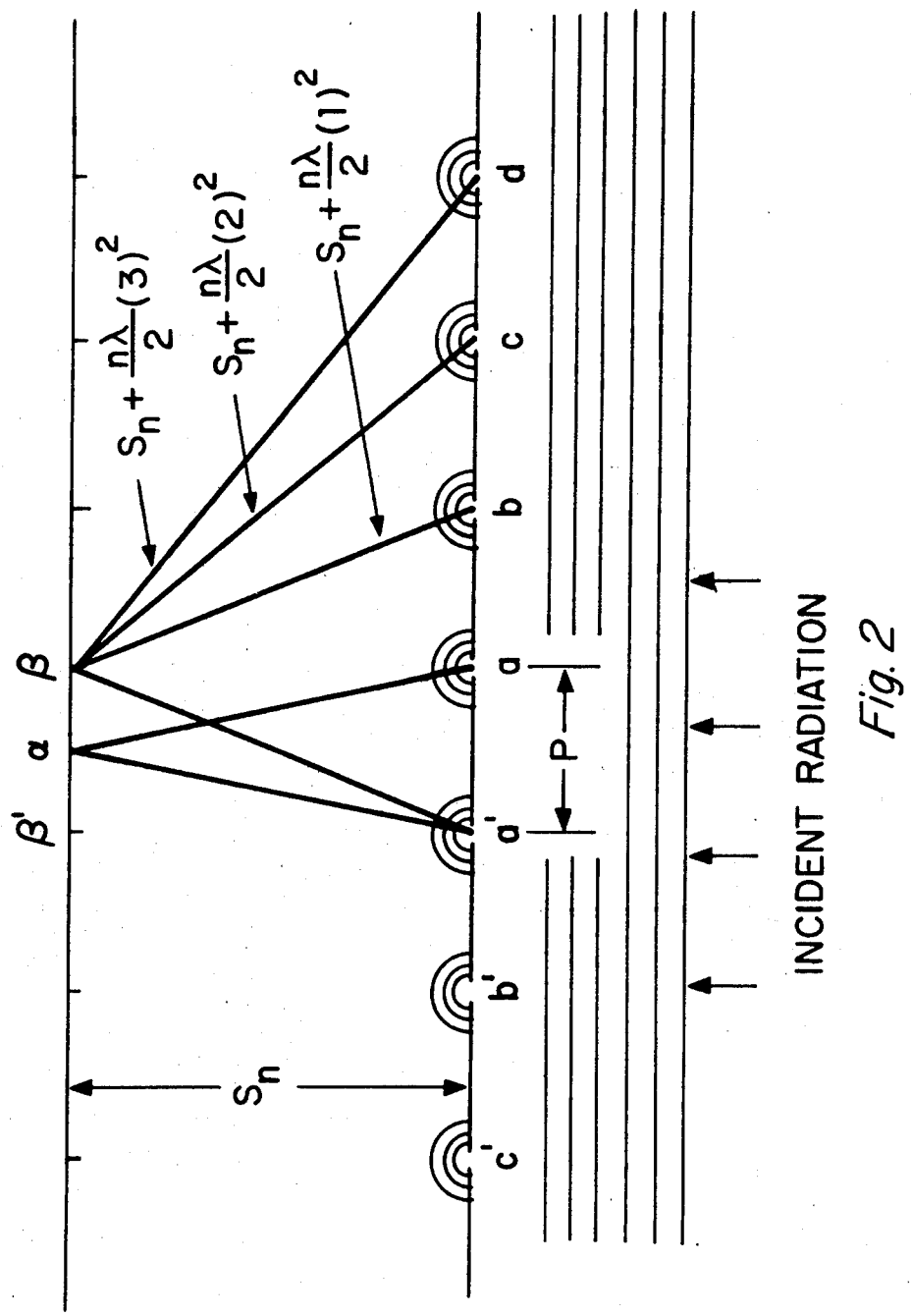
FIG. 2 is a diagrammatic representation of spatial-period-division.
Figure 9:
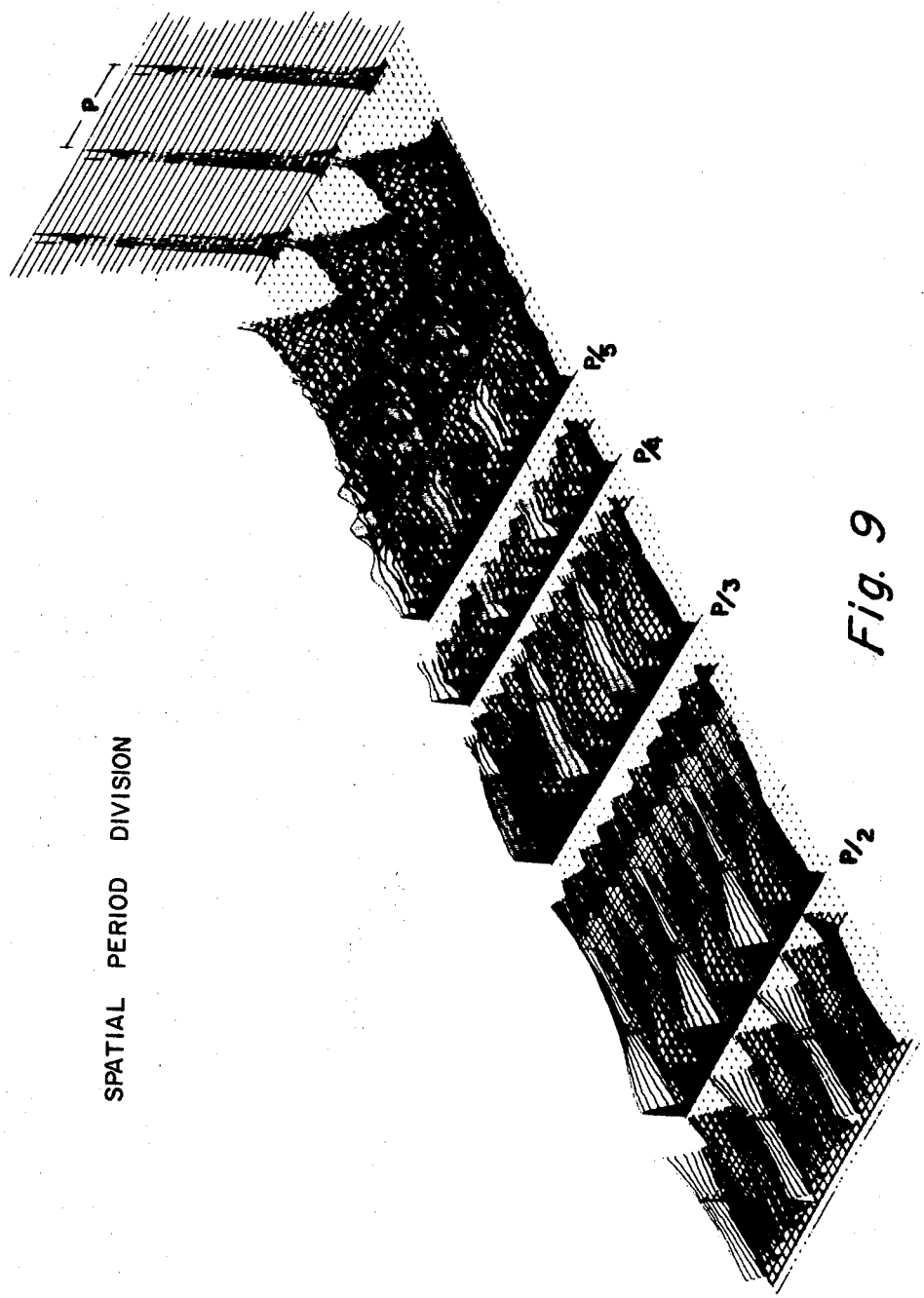
FIG. 9 is a computer generated plot of the near field diffraction from a parent mask of period "p" and slit width p/10 when it is illuminated with radiation of about 20% bandwidth and small angular divergence. Spatial frequency doubling (p/2), tripling (p/3), quadrupling (p/4) and quintripling (p/5) are shown.

Referring to FIG. 2, there is shown a diagrammatic representation of the basic principles of spatial-period division embodied in the invention. A periodic array of slits a–d and a′–c′ is illuminated with radiant energy of wavelength λ from a distant point source. Radiation from slits a and a′ will be in phase, and produce an intensity maximum at point α for all distances S. However, at a certain distance $S_2$, the difference in length between paths a′, β and aβ will be one wavelength, and the path length from the remaining slits to β will differ from aβ by integral multiples of the wavelength λ. The result is an intensity maximum at β, and by symmetry, also at β′. This intensity pattern with maxima at β′, α and β, will have a spatial period p/2 and thus corresponds to a "doubling" of the original grating's spatial frequency. It can be shown that other spatial frequency multiples will occur at distances given by $S_n = p^2/n\lambda$, where n is an integer greater than 1. The intensity patterns of the spatial-frequency multiples are a function of the widths of the slits in the parent mask. For monochromatic collimated radiation the three db width of the intensity peaks is approximately equal to the width of the slits. If the source has some angular divergence and a moderate bandwidth of the order of 20%, the intensity patterns of the spatial-frequency-multiples will be approximately sinusoidal superimposed on a low level background, as illustrated in FIG. 9. Such patterns are adequate for exposure of high contrast re $$\Delta S_n \sim \frac{1}{2}\left(\frac{S_{n-1} - S_{n+1}}{2}\right) \sim \frac{p^2}{2\lambda(n^2 - 1)}$$

Theory predicts that the quality of the $n^{th}$ spatial-frequency-multiple is optimized; that is, spatial-harmonics less than n are minimized, if the slit width is $\leq p/2n$.

Figure 4:
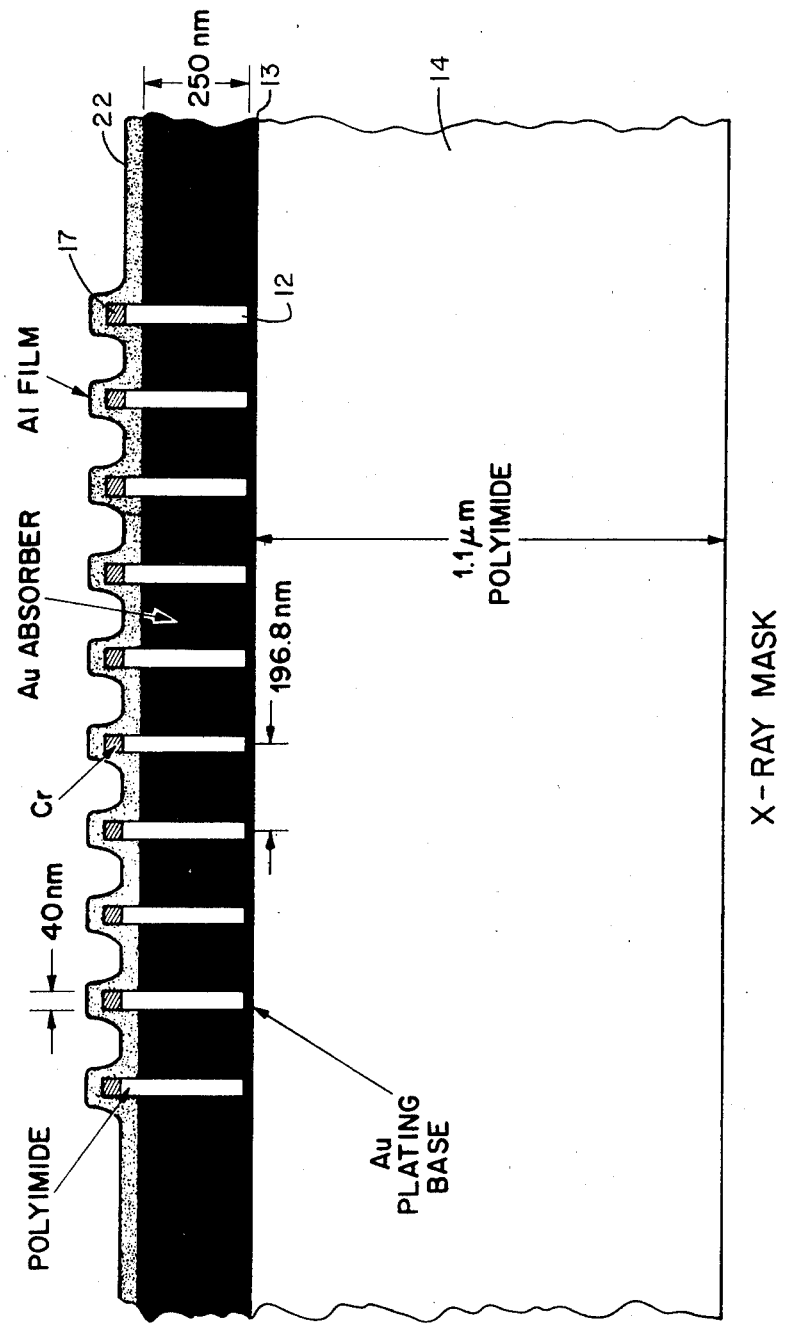
FIG. 4 is a cross-sectional diagram of an exemplary parent X-ray mask having a 196.8 nm period for exposing the second spatial-frequency-multiple, a 98.4 nm period grating.

According to the specific example of the invention, a simple laboratory source of carbon K soft X-rays (λ=4.5 nm) illuminated a resist, specifically PMMA, through an X-ray parent mask having a grating pattern of 196.8 nm spatial period with slits 40 nm wide, approximately the optimum slit-width for doubling. An oblique-shadowing technique, such as described in copending application Ser. No. 43,309 of Dale C. Flanders filed May 29, 1979, entitled X-ray Lithography at ~100 A° Linewidths Using X-ray Masks Fabricated by Shadowing Techniques assigned to the assignee of this application and incorporated herein by reference, was used to produce a first mask having absorber stripes effectively 40 nm wide. This first mask was then "reversed in polarity" upon a second mask, using a lift-off process, to yield a mask with 40 nm wide opening in gold 40 nm thick. The second mask was then used to produce a third mask using the process of FIG. 3A–3G which shows, in section, a fragmentary portion of the mask as it is processed. The mask includes PMMA high-resolution X-ray-sensitive resist 11 on a first polyimide layer 12 with a gold plating base 13 sandwiched between layer 12 and a second polyimide layer 14 that is on a glass substrate 15. The PMMA is then X-ray exposed and developed to form slits 16 exposing the surface of the first polyimide layer 12 as shown in FIG. 3B. Chrome is then evaporated on the surface to form the chrome layer 17 as shown in FIG. 3C. The PMMA is then dissolved so that only the chrome strips 17 that were in the gaps 16 remain on the first polyimide surface 12 as shown in FIG. 3D. The first polyimide layer 12 is then oxygen ion beam-etched away except beneath the chrome strips 17 to expose the surface of the gold plating base 13 as shown in 3E. The exposed gold plating base 13 is electroplated with a gold layer 21 as shown in FIG. 3F. Then glass layer 15 is removed to complete the mask as shown in FIG. 3G with the bars formed by polyimide layer 12 and chrome 17 defining the slit widths and the separation between centers of these slits being the parent mask spatial period. Referring to FIG. 4, there is shown a cross section of a completed parent mask drawn substantially to scale with specific dimensions as set forth corresponding essentially to the structure of FIG. 3G but covered with an aluminum film 22.

In order to expose a pattern with twice the spatial frequency of the parent mask of FIG. 4 (i.e., doubling), the gap $S_2$ between the grating of the parent mask at plating base 13 and the resist film should be approximately 4.3 μm.

Figure 5:
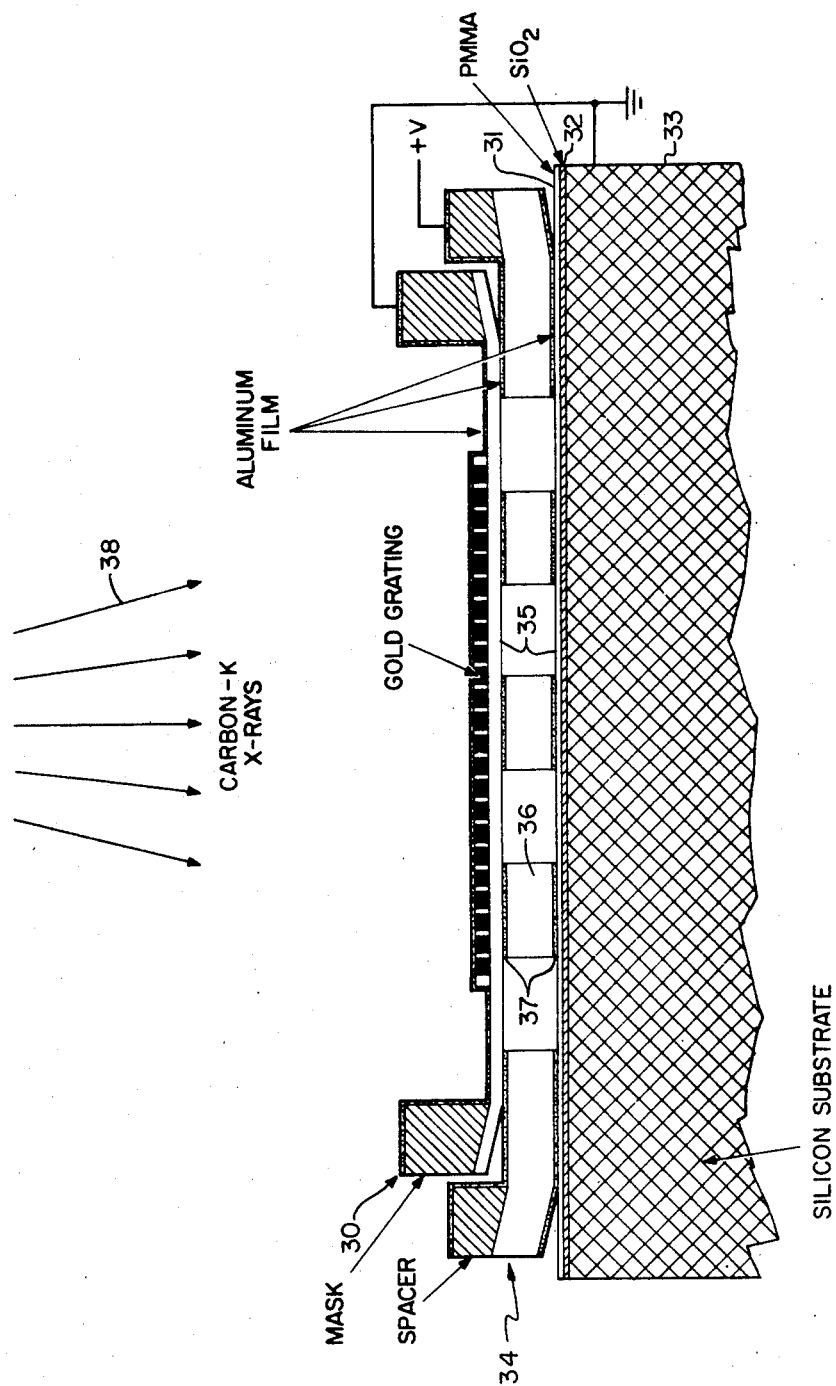
FIG. 5 is a cross-sectional diagram of an assembly with the means for maintaining a well-defined spacing between parent mask and substrate film during exposure.

Referring to FIG. 5, there is shown in cross section an assembly including means for establishing and controlling this gap for exposing a PMMA resist 31 over a silicon oxide layer 32 on a silicon substrate 33 through parent mask 30 supported by spacer 34. Spacer 34 comprises solid members typically polyimide 35 between aluminum films 37. These solid portions attenuate the carbon K X-rays by about 9 db so that the image on photoresist 31 beneath them is underexposed.

Penumbra, due to the finite size of the source of carbon K X-rays 38, determine how close the assembly of FIG. 5 could be brought to the X-ray source, and thus determine exposure time. The penumbra is given by Δ=Sd/D, where D is the source-to-mask distance, S is the mask-to-substrate gap and d is the source diameter. For doubling a 196.8 nm. grating, S=4.3 μm, and Δ should be less than 196.8 nm/4. In the specific example the source diameter was 1 mm, and thus D should be greater than 87 mm and was 115 mm, corresponding to an exposure time of 21 hours for the carbon K source operated at 4.8 kV and 70 ma. A synchrotron source of X-rays is preferred to allow shorter exposure times. Table 1 lists exposure times for a variety of spatial-frequency multiples and two parent mask periods for a synchrotron source. Alternatively, exposure times may be reduced by using a source of smaller diameter or linear geometry, or hot plasma sources.

SPATIAL-PERIOD-DIVISION USING SYNCHROTRON RADIATION

Power Radiated in 10% Bandwidth

Centered at 263 ev (λ=4.7 nm)

| | MULTIPLE | GAP (μm) | APPROX DEPTH OF FIELD (μm) | PERIOD PRODUCED (μm) | EXPOSURE* TIME (sec) |
|---|---|---|---|---|---|
| 1.0 μm period parent mask (10nm slits) | 2nd | 98.0 | 32.7 | 0.5 | 2 |
| | 3rd | 65.4 | 12.2 | 0.33 | 3 |
| | 4th | 49.0 | 6.5 | 0.25 | 4 |
| | 5th | 39.2 | 4.1 | 0.20 | 5 |
| 0.2 μm period parent mask (10nm slits) | 2nd | 3.92 | 1.3 | 0.1 | 2 |
| | 3rd | 2.61 | 0.5 | 0.067 | 3 |
| | 4th | 1.96 | 0.26 | 0.05 | 4 |
| | 5th | 1.57 | 0.16 | 0.04 | 5 |

*Calculated exposure times for PMMA and a source intensity of 1 watt/cm².

Figure 6A:
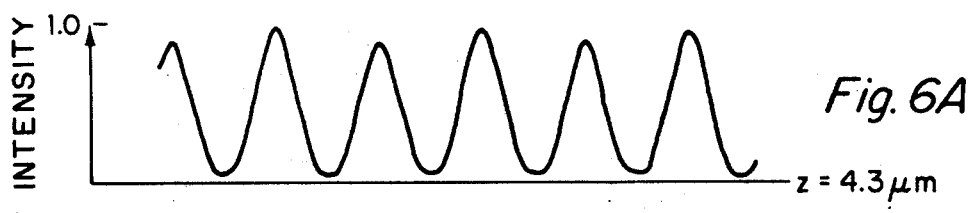
FIGS. 6A–6C show graphical representations of numerical calculations of the intensity of the second, third and fourth spatial-frequency multiples of the 196.8 nm period mask depicted in FIG. 6D assuming the cross sectional profile shown in FIG. 4, an X-ray source of 1 mm diameter and a source-to-mask distance of 115 mm.
Figure 6B:
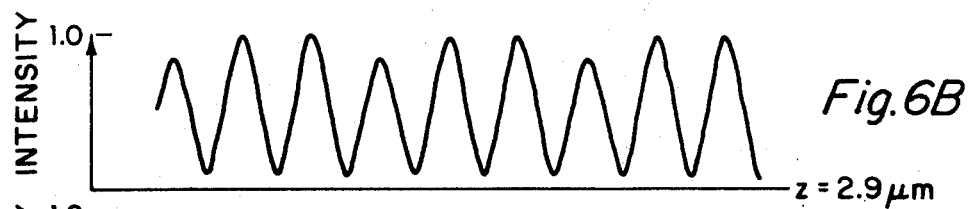
Figure 6C:
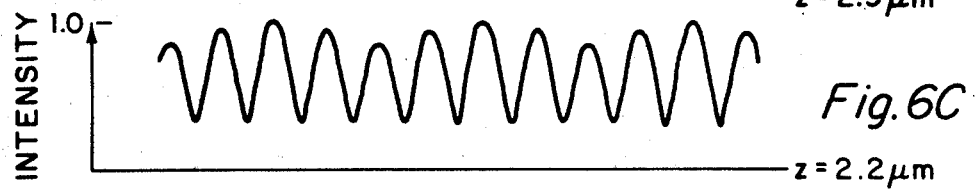
Figure 6D:
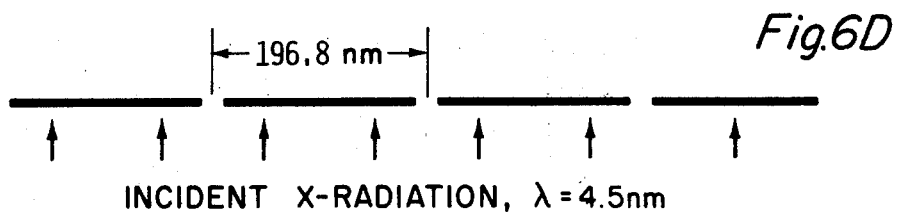

Referring to FIGS. 6A–6C, there is shown a graphical representation of the calculated intensity for second, third and fourth spatial-frequency multiples, respectively, of the 196.8 nm. grating shown in FIG. 6D. The plots were calculated numerically, taking into account the angular divergence of the X-rays from the source.

These plots were verified experimentally by a light optical simultaion of the X-ray configuration. A scale factor of approximately 100 was achieved by substituting white light through an orange filter for the 4.5 nm X-ray source and a parent photomask having a 16.9 μm period grating etched in chromium instead of the 196.8 nm. period grating X-ray mask 30. This chromium mask was exposed by electron beam lithography and had slit widths of 1.7 μm.

Figure 7A:
FIG. 7A is a photomicrograph of a parent mask having a 16.9 $\mu$m period.
Figure 7B:
FIGS. 7B–7C are photomicrographs of patterns exposed in photographic film through the parent mask of 7A using an incandescent lamp through an orange filter at separations suitable for producing the fourth, third and second spatial-frequency-multiples, respectively, of the parent mask in FIG. 7A.
Figure 7C:
Figure 7D:

Referring to FIGS. 7A-7D, there are shown photomicrographs of the parent mask, 7A, and of spatial frequency quadrupling, tripling and doubling, FIGS. 7B, C and D, respectively, produced in photographic film. Exposure was done through the parent mask with an incandescent lamp through an orange filter.

Figure 8:
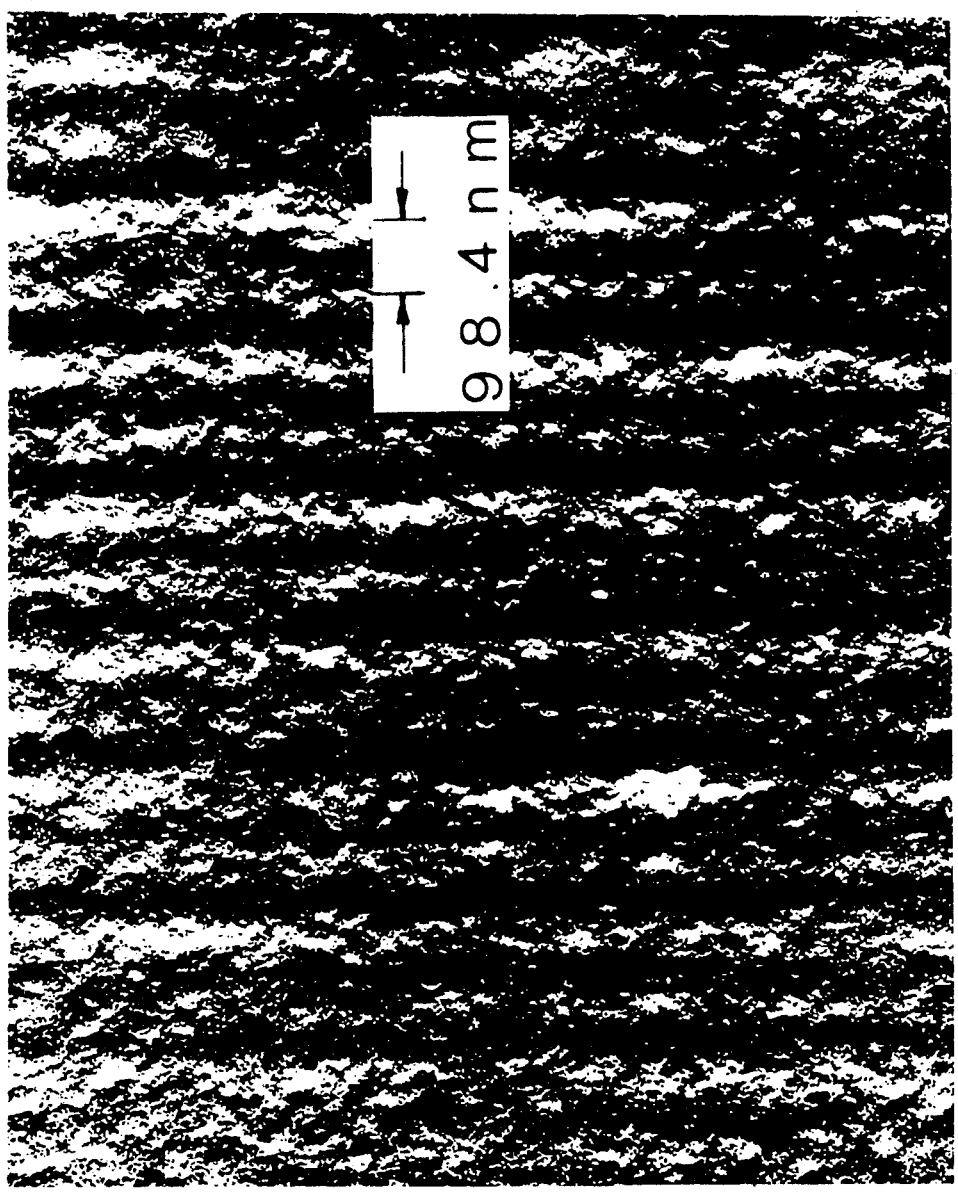
FIG. 8 is an electron micrograph showing the exposure in PMMA of a 98.4 nm spatial period grating using the parent mask shown in FIG. 4 having a 196.8 nm period.

Referring to FIG. 8, there is shown an electron micrograph of the pattern developed in the PMMA layer 31 of FIG. 5. A 98.4 nm spatial-period grating was produced by spatial-period division, that is the second spatial-frequency multiple of the 196.8 nm X-ray parent mask 30. The parent mask 30 producing the result in FIG. 8 was not the ideal structure of FIG. 4; gold having over-plated the slots in the polyimide layer 12 and bridged across.

In principle, the invention can be extended down to the limit of microlithography, believed to be about 10 nm spatial period.

The absorbing regions of the parent mask should have a high attenuation, preferably greater than 20 db. Otherwise, the radiation transmitted through the absorber can interfere with the diffracted radiation to produce undesirable spatial-harmonic components. Alternatively, if 50% of the incident radiation is phase shifted by $\pi$ in passing through the mask pattern, the zero-order diffracted beam can be canceled as explained in (15). If $p<2\lambda$, only the first-order diffracted beams will be present, and their interference will produce only the second spatial-frequency multiple. At optical and UV wavelengths, it is easy to achieve both zero-order cancellation and $p<2\lambda$. At 4.5 nm wavelength, on the other hand, gold attenuates 128 db/μm, and the phase shift is approximately 1° per nm. Both high attenuation and a $\pi$ phase shift require a thick absorber of the order of 200 nm. This is possible using electroplating as illustrated in FIGS. 3 and 4.

If the parent mask introduces a phase shift of $\pi$, thereby cancelling the zero-order beam and $p<2\lambda$, doubling of any spatial frequency occurs at all distances. This feature enables doubling of quasi-periodic structures such as variable period gratings, grids and Fresnel zone plates that may be useful in making structures of X-ray imaging and spectroscopy.

In addition to optical, UV and X-ray photons, particles such as electrons, ions and neutrons can also be used for spatial-period-division, by virtue of their wave nature.

Spatial-period-division applies to grids and arrays of apertures. Such an application would be an elementary extension of the methods taught above.

There has been described novel apparatus and techniques relatively free from complexity that provide a means of exposing large-area, low-distortion, periodic structures. Spatial periods below 100 nm are readily exposed. When used with soft X-rays, back reflection from substrates is avoided, thereby permitting high aspect-ratio structures. The profile of the intensity pattern can be altered by varying the parent-mask slit width.

It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

REFERENCES

1. A. Yariv, Sci. Amer., 240, 64–72 (1979).
2. A. Yariv and M. Nakamura, IEEE J. Quantum Electronics QE-13, 233–253 (1977).
3. H. I. Smith and D. C. Flanders, Appl. Phys. Lett. 32, 349–350 (1978).
4. M. W. Geis, D. C. Flanders and H. I. Smith, Appl. Phys, Lett. 35, 71 (1979).
5. H. Sakaki, K. Wagatsuma, J. Hamasaki and S. Saito, Thin Solid Films 36, 497 (1976).
6. H. I. Smith, S. R. Chinn and P. D. DeGraff, J. Vac. Sci. Tech. 12, 1262–1265 (1975).
7. D. C. Shaver, D. C. Flanders, H. I. Smith and N. M. Ceglio, J. Vac. Sci. Tech. 16, 1926 (1979).
8. D. C. Flanders, H. I. Smith, H. W. Lehmann, R. Widmer and D. C. Shaver, Appl. Phy. Lett. 32, 112–114 (1978).
9. C. V. Shank and R. V. Schmidt, Appl. Phys. Lett. 23, 154–155 (1973).
10. G. C. Bjorklund, S. E. Harris, and J. F. Young, Appl. Phys. Lett. 25, 451–452 (1974).
11. T. Winthrop and C. R. Worthington, J. Opt. Soc. Amer. 55, 373–381 (1965).
12. D. C. Flanders, J. Vac. Sci. Tech. 16, 1615 (1979).
13. K. Knop, Optics Comm. 18, 298–303 (1976).
14. P. D. DeGraff, D. C. Flanders, J. Vac. Sci. Tech. 16, 1906 (1979).

What is claimed is:

1. A method for producing gratings which method includes the steps of,
   exposing a substrate to X-ray radiant energy of wavelength $\lambda$ through a parent mask having a pattern of slits of period p defined by X-ray absorbing material with sufficient attenuation to produce with the X-ray energy transmitted through said parent mask a sharp image on said substrate,
   and spacing said parent mask from said substrate a distance S substantially equal to $p^2/n\lambda$ where $\lambda$ is the wavelength of said X-radiation and n is an integer greater than one to provide said image with an intensity pattern of period p/n on said substrate.

2. Apparatus for practicing the process of claim 1 comprising,
   said substrate carrying an X-ray radiation sensitive layer on the surface thereof,
   said parent mask,
   and means for supporting said parent mask spaced from said layer said distance S.

3. Apparatus in accordance with claim 2 wherein said resist layer is PMMA.

4. Apparatus in accordance with claim 2 wherein the width of each of said slits is $\leq p/2n$.

5. A method for producing gratings, in accordance with claim 1 wherein the spatial period of the pattern of slits on the parent mask varies as a function of position to produce quasi-periodic gratings.

6. A method for producing grids which method includes the steps of exposing a substrate to X-ray radiant energy of wavelength $\lambda$ through a parent mask having a grid pattern of apertures, the widths of which are less than one half of the local spatial period p defined by X-ray absorbing material with sufficient attenuation to produce with the X-ray energy transmitted through said parent mask a sharp image on said substrate, and spacing said parent mask from said substrate a distance S substantially equal to $p^2/n\lambda$ where $\lambda$ is the wavelength of said X-radiation and n is an integer greater than one, to provide said image with an intensity pattern of period p/n on said substrate.

7. A method of producing a Fresnel zone pattern which method includes the steps of exposing a substrate to radiant energy of wavelength $\lambda$ through a parent mask having a pattern of Fresnel-zone concentric circular apertures, the widths of which are less than one half of the local spatial period, p, and spacing said parent mask from said substrate a distance S substantially equal to $p^2/n\lambda$ where $\lambda$ is the wavelength of said radiation and n is an integer greater than one, to provide an intensity pattern on said substrate having the form of a Fresnel zone pattern.

8. A method for producing gratings, grids and Fresnel-zone patterns which method includes the steps of exposing a substrate to radiant energy of wavelength $\lambda$ through a parent mask having a pattern of apertures in the form of a grating, a grid or a set of Fresnel zones, wherein the thickness of the material between the parent mask apertures is such that radiation passing through it suffers a differential phase shift that is an odd multiple of $\pi$ radians relative to radiation passing through the apertures.

* * * * *